US011065898B2

(12) United States Patent
Fukasawa et al.

(10) Patent No.: US 11,065,898 B2
(45) Date of Patent: Jul. 20, 2021

(54) ELECTRONIC APPARATUS, INFORMATION PROCESSOR, PRINTING SYSTEM, AND PRINTING METHOD

(71) Applicant: SONY CORPORATION, Tokyo (JP)

(72) Inventors: Soichi Fukasawa, Saitama (JP); Fumiko Shiga, Tokyo (JP); Naoko Ishiduka, Kanagawa (JP); Yue Ouyang, Tokyo (JP); Sachiko Takahashi, Tokyo (JP); Akira Tange, Tokyo (JP); Shogo Kawata, Tokyo (JP); Nobuyuki Uchiyama, Kanagawa (JP); Tomomasa Watanabe, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 436 days.

(21) Appl. No.: 15/779,756

(22) PCT Filed: Dec. 8, 2016

(86) PCT No.: PCT/JP2016/086616
§ 371 (c)(1),
(2) Date: May 29, 2018

(87) PCT Pub. No.: WO2017/104545
PCT Pub. Date: Jun. 22, 2017

(65) Prior Publication Data
US 2020/0307291 A1 Oct. 1, 2020

(30) Foreign Application Priority Data
Dec. 18, 2015 (JP) .............................. JP2015-247268

(51) Int. Cl.
B41J 29/393 (2006.01)
A45D 29/22 (2006.01)
A45D 29/00 (2006.01)

(52) U.S. Cl.
CPC ............ B41J 29/393 (2013.01); A45D 29/22 (2013.01); A45D 2029/005 (2013.01)

(58) Field of Classification Search
CPC .................... B41J 29/393; A45D 2029/005
See application file for complete search history.

(56) References Cited

FOREIGN PATENT DOCUMENTS

JP 2004-188714 A 7/2004
JP 2009-266193 A 11/2009
(Continued)

OTHER PUBLICATIONS

IP.com search (Year: 2020).*
(Continued)

Primary Examiner — Lisa Solomon
(74) Attorney, Agent, or Firm — Chip Law Group

(57) ABSTRACT

An electronic apparatus according to an embodiment of the technology includes an obtaining section, a determining section, and an instructing section. The obtaining section obtains a first design image or corresponding data corresponding to the first design image. The determining section determines one or a plurality of second design images different from the first design image on the basis of the first design image or the corresponding data obtained by the obtaining section. The instructing section instructs printing of one or both of the one second design image determined by the determining section and a plurality of the second design images determined by the determining section.

10 Claims, 14 Drawing Sheets

(56) References Cited

FOREIGN PATENT DOCUMENTS

| JP | 2012-010848 A | 1/2012 |
| JP | 2012-020035 A | 2/2012 |
| JP | 2012-095885 A | 5/2012 |
| JP | 2012-135587 A | 7/2012 |
| JP | 2013-192594 A | 9/2013 |
| JP | 2013-220146 A | 10/2013 |

OTHER PUBLICATIONS

International Search Report and Written Opinion of PCT Application No. PCT/JP2016/086616, dated Jan. 10, 2017, 09 pages of ISRWO.
Office Action for JP Patent Application No. 2017-556014 dated Jan. 5, 2021, 05 pages of Office Action and 04 pages of English Translation.

* cited by examiner

[FIG. 1]
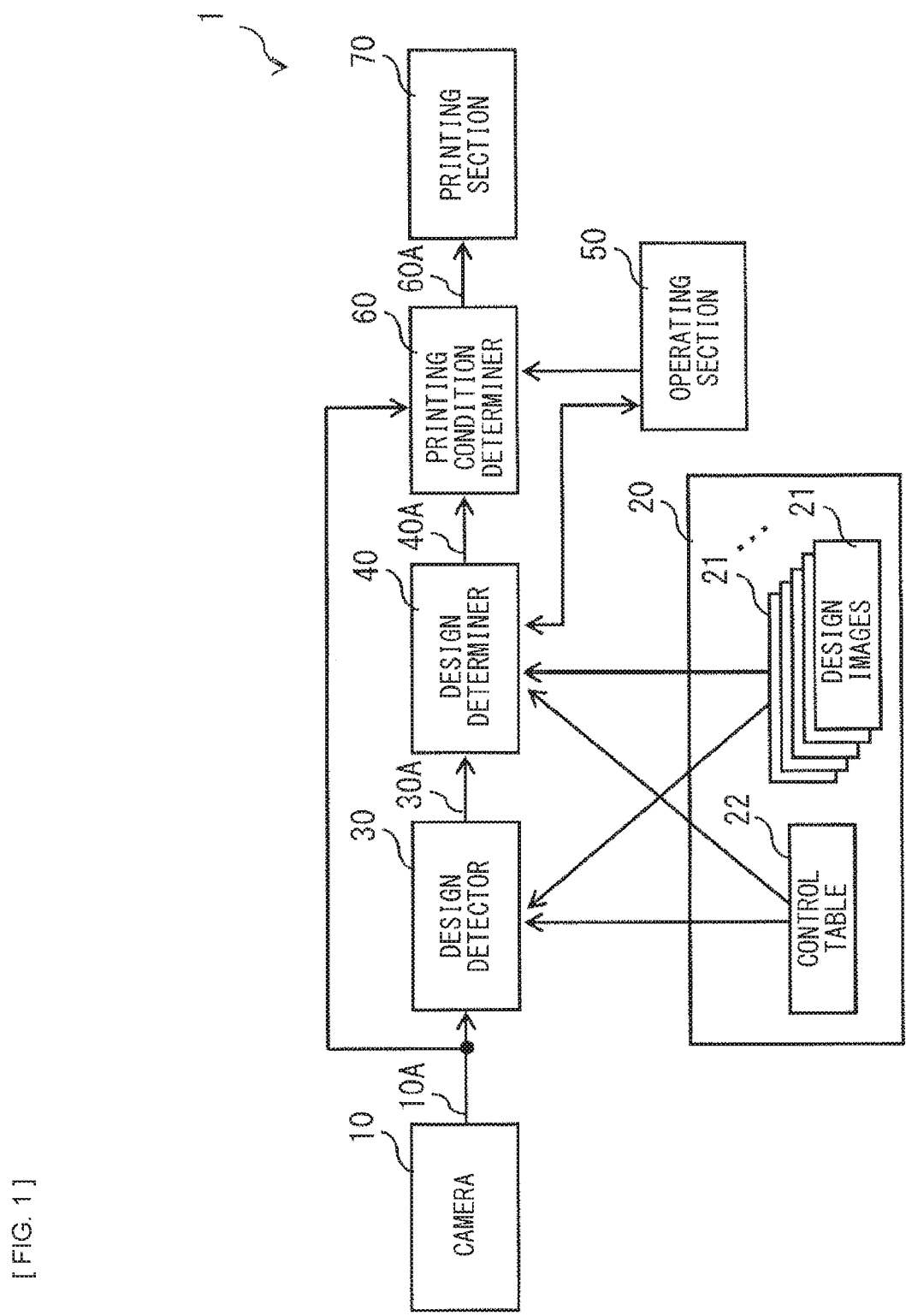

[FIG. 2]

| DESIGN ID | DESIGN IMAGE |
|---|---|
| 1 | IMAGE DATA A |
| 2 | IMAGE DATA B |
| 3 | IMAGE DATA C |
| 4 | IMAGE DATA D |
| 5 | IMAGE DATA E |
| 6 | IMAGE DATA F |
| ⋮ | ⋮ |

| CHARA-CTER ID | GROUP ID | MEMBER ID | TYPE | DESIGN ID | GROUP CONDITION | PRINTA-BILITY |
|---|---|---|---|---|---|---|
| 1 | 1 | 1 | GROUP DESIGN | 1 | MEMBER ID = 2, 3 | PRINTABLE |
| 1 | 2 | 2 | NORMAL DESIGN | 2 | — | UNPRINTABLE |
| 1 | 1 | 12 | NORMAL DESIGN | 12 | — | PRINTABLE |
| 1 | 2 | 3 | GROUP DESIGN | 3 | MEMBER ID = 2, 3 | PRINTABLE |
| 1 | 2 | 4 | NORMAL DESIGN | 4 | — | PRINTABLE |
| 1 | 2 | 32 | NORMAL DESIGN | 32 | — | UNPRINTABLE |
| 2 | 1 | 1 | GROUP DESIGN | 1 | MEMBER ID = 2, 3 | PRINTABLE |
| 2 | 1 | 2 | NORMAL DESIGN | 2 | — | PRINTABLE |
| ⋮ | ⋮ | ⋮ | ⋮ | ⋮ | ⋮ | ⋮ |

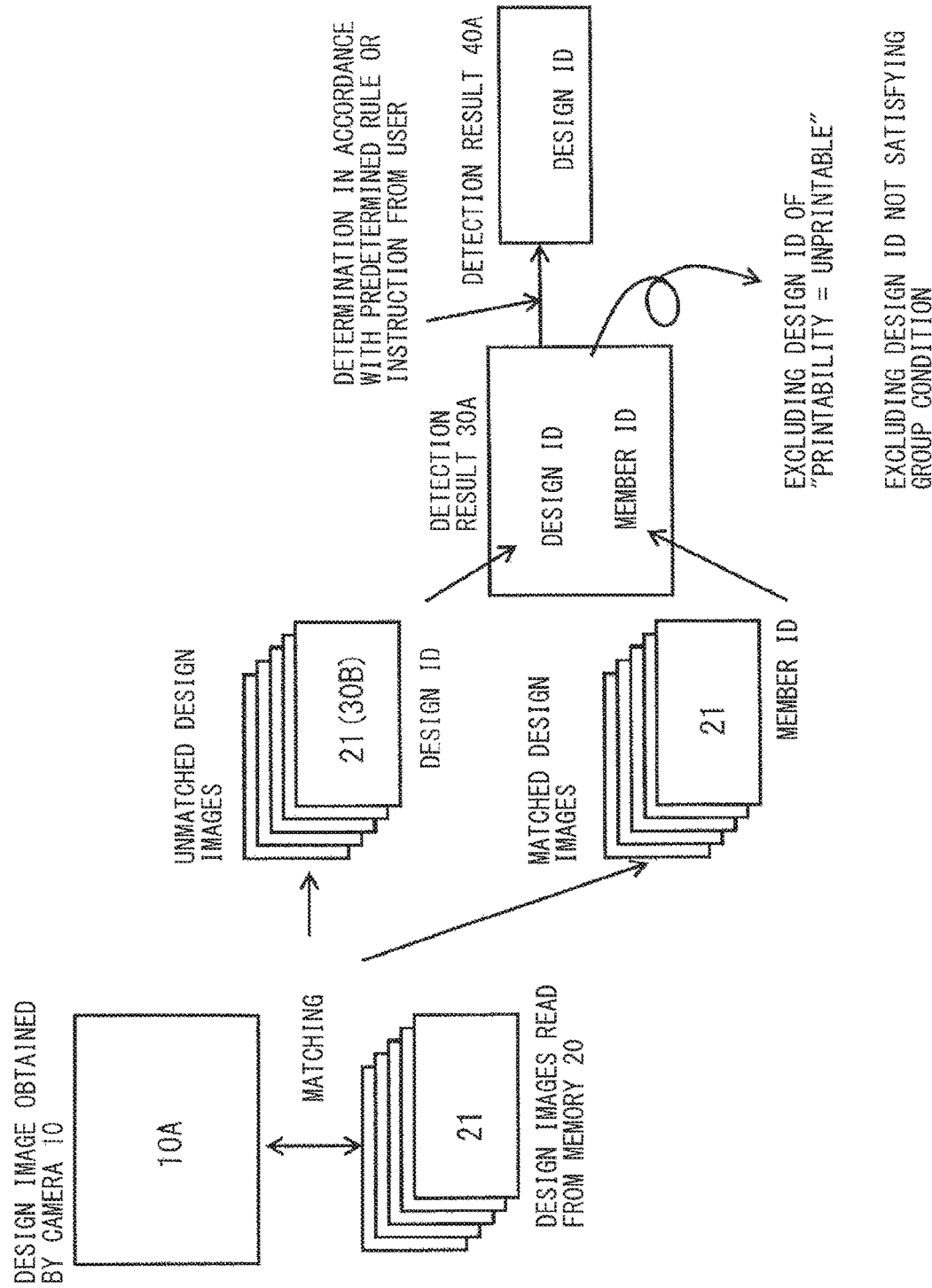
[FIG. 4]

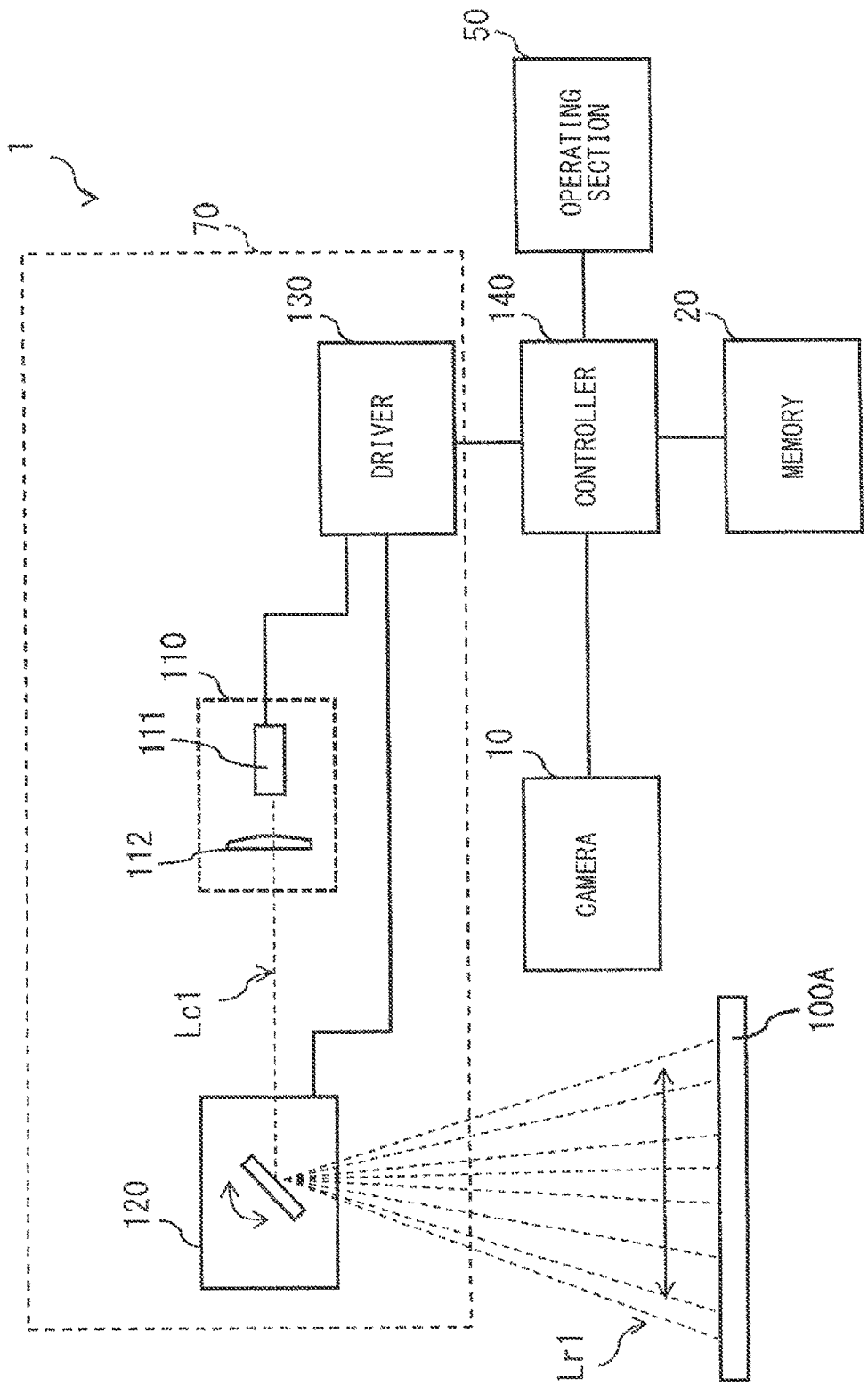
[FIG. 5]

[FIG. 6]
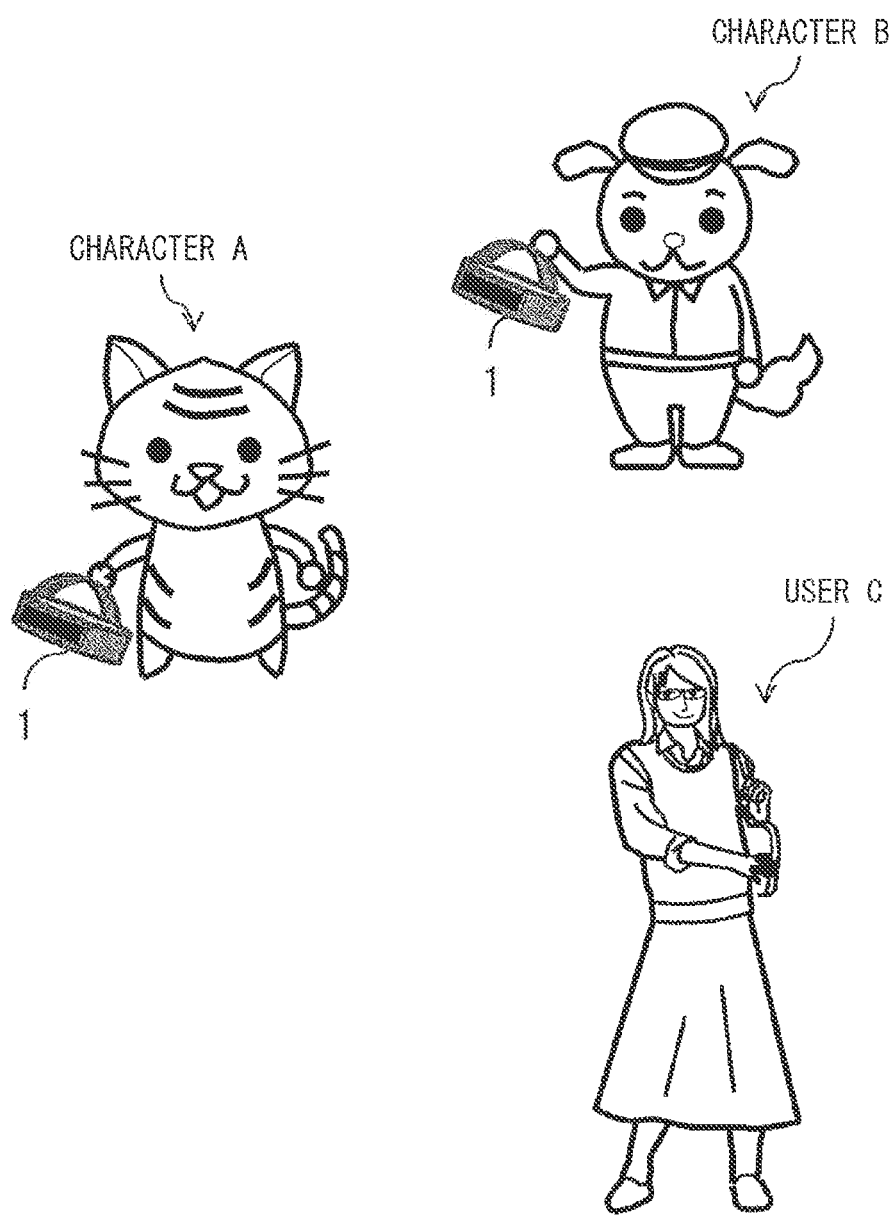

[FIG. 7]
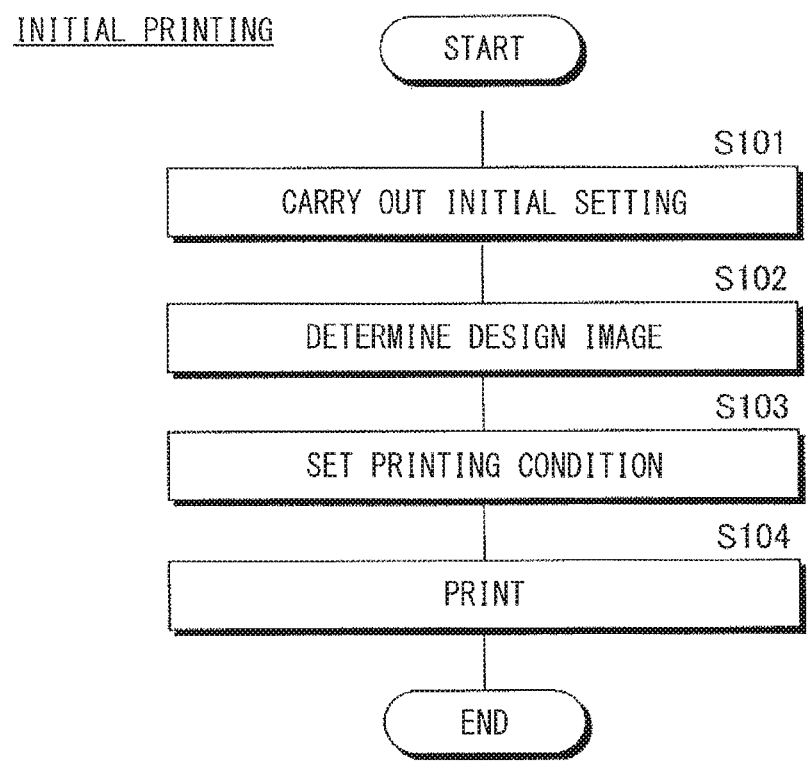
[FIG. 8]
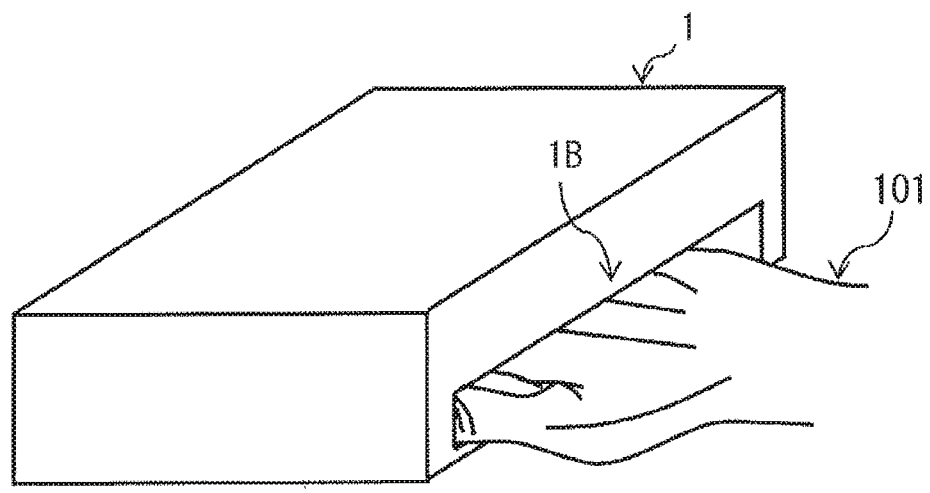

[FIG. 9]
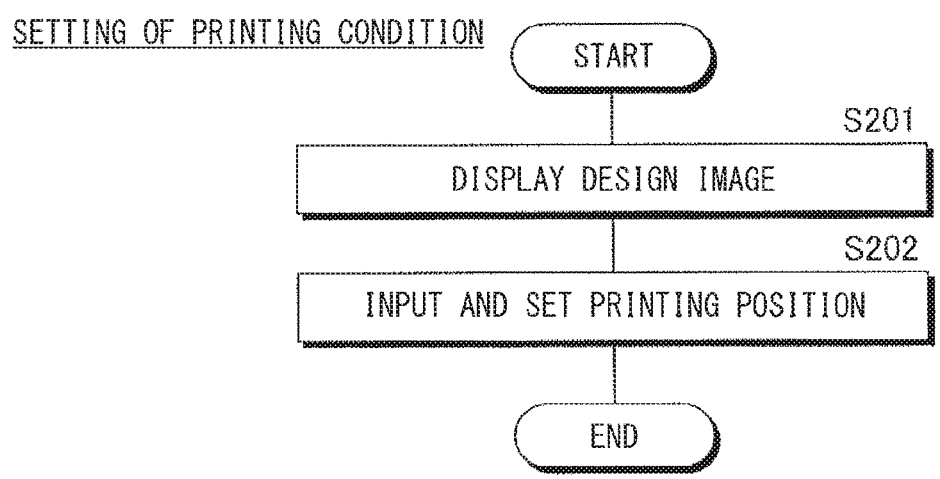
[FIG. 10]
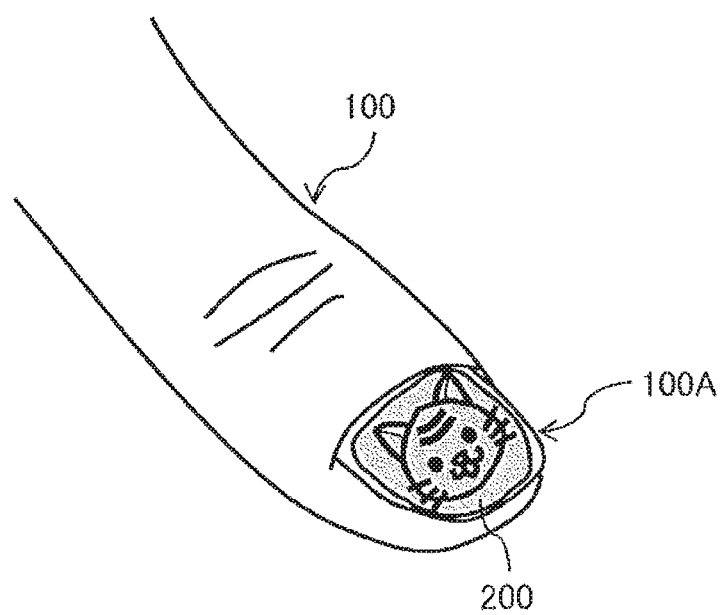

[ FIG. 11 ]
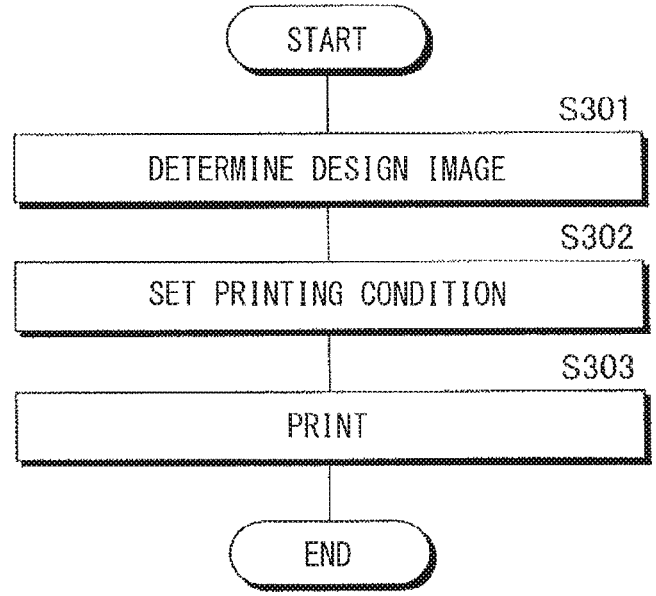
[ FIG. 12 ]
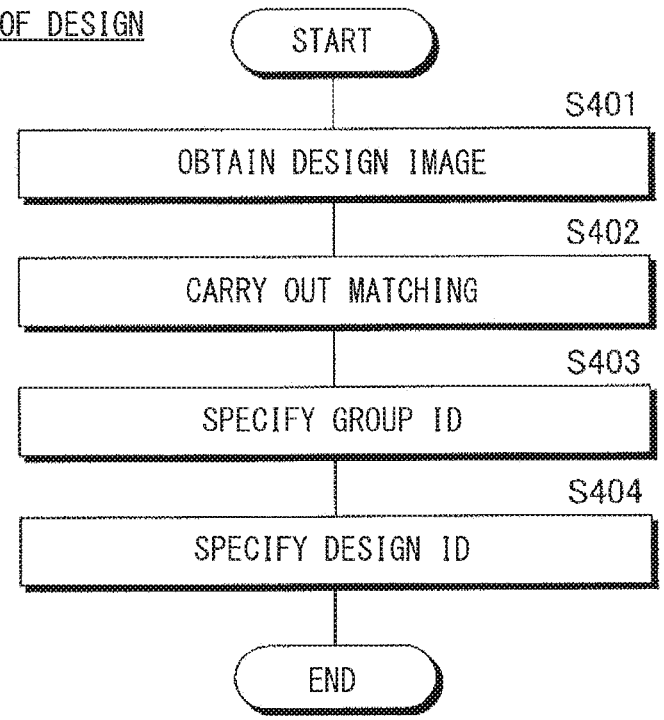

[ FIG. 13 ]
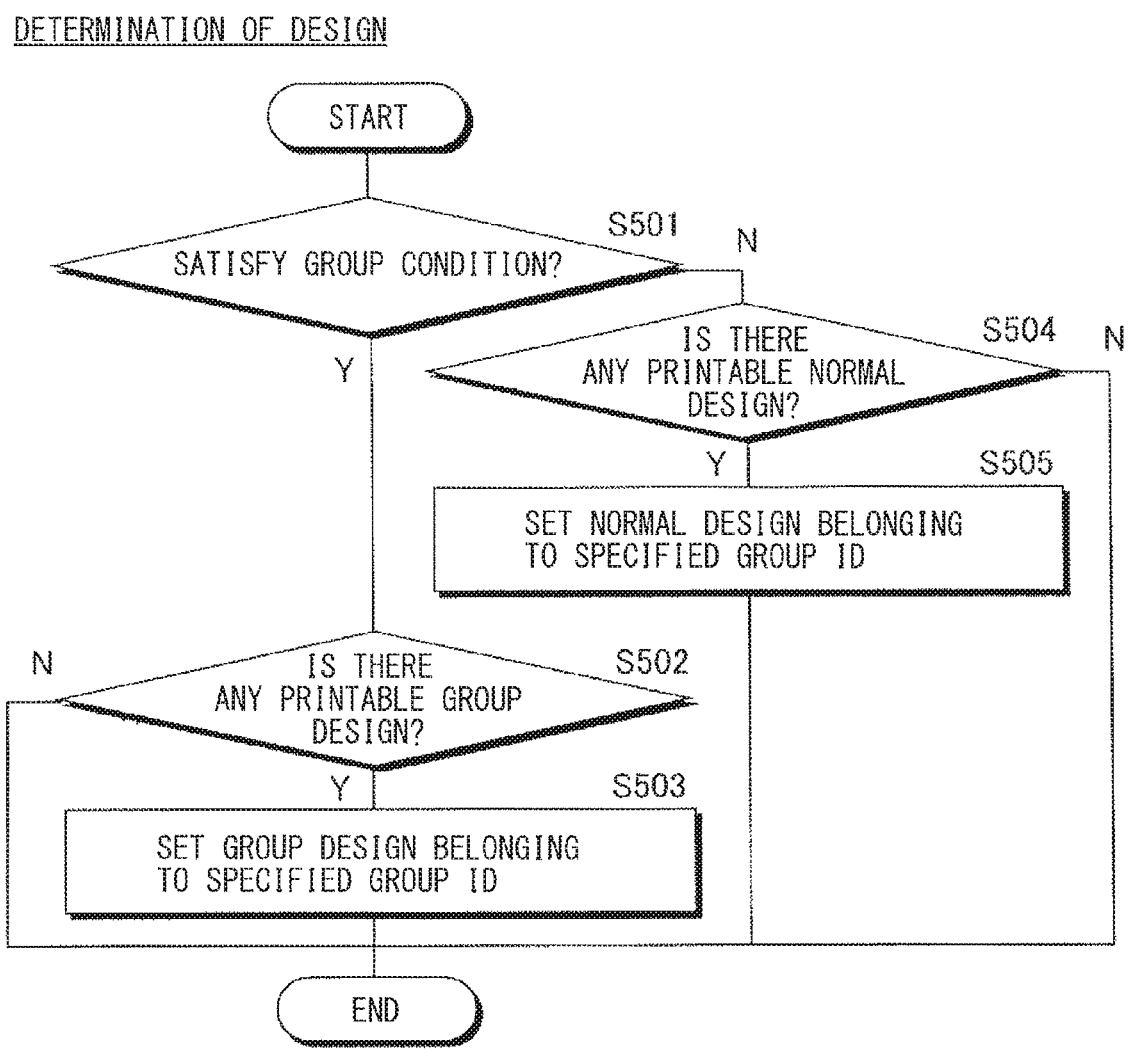

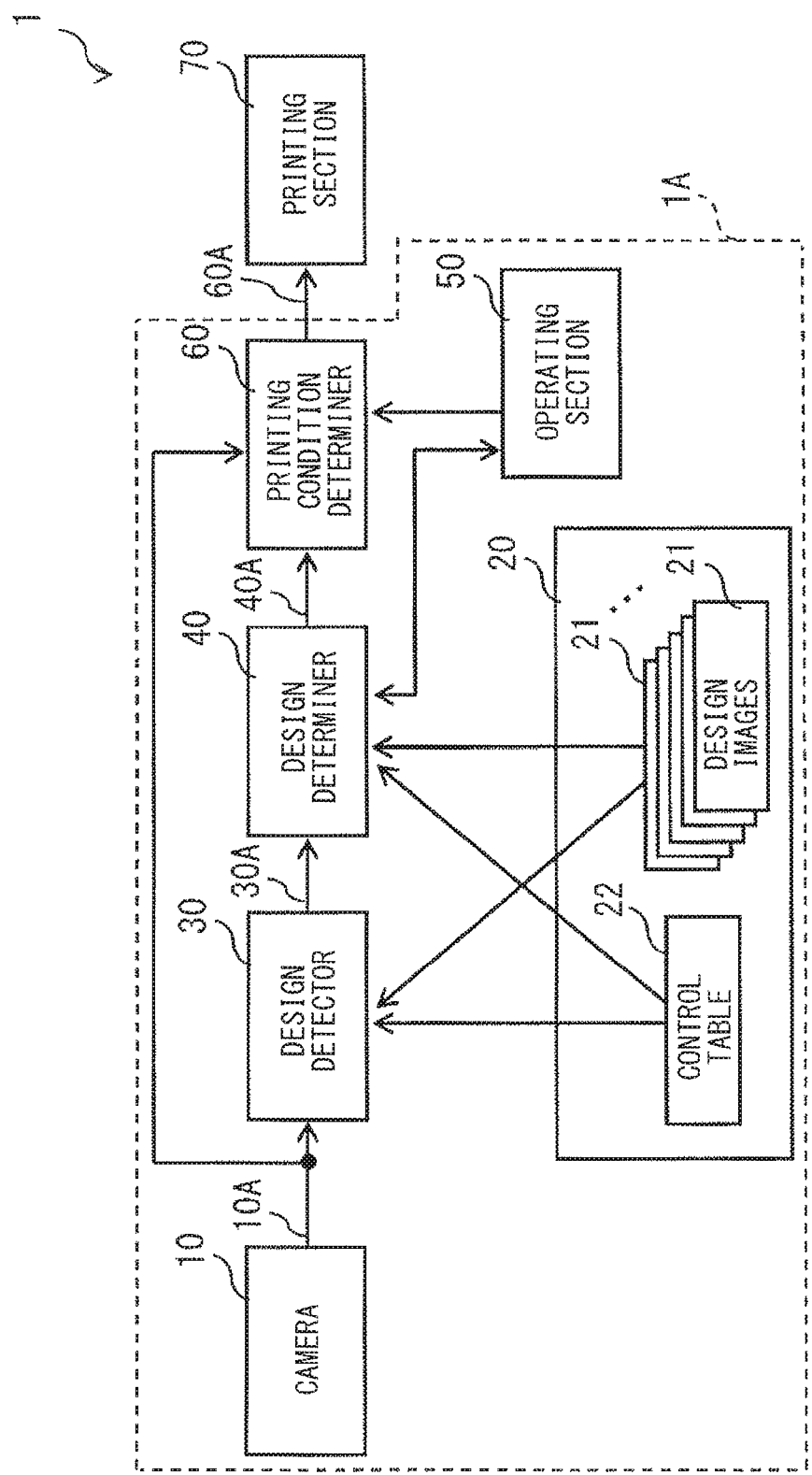
[FIG. 14]

[FIG. 15]
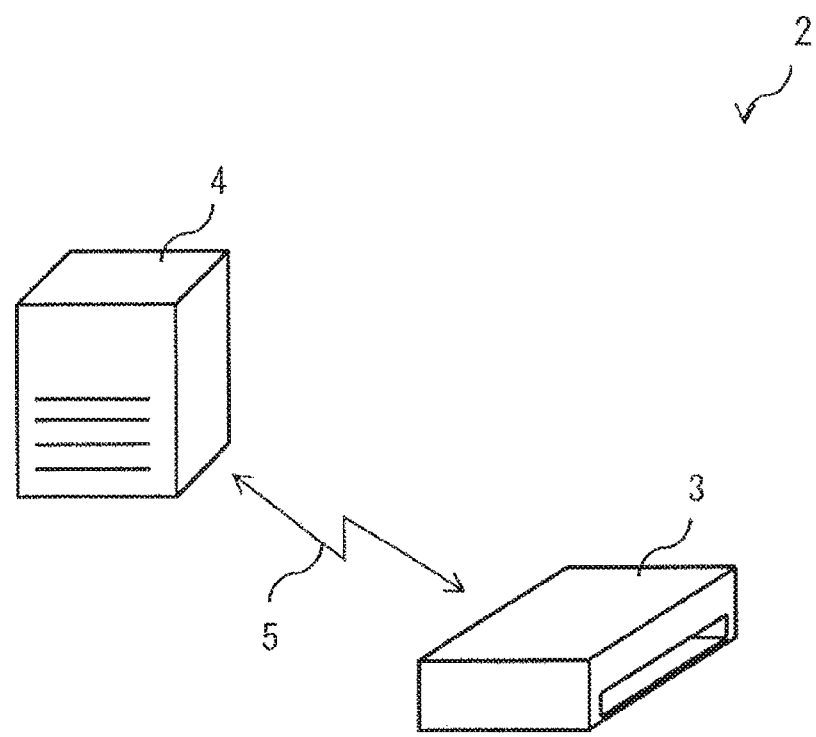

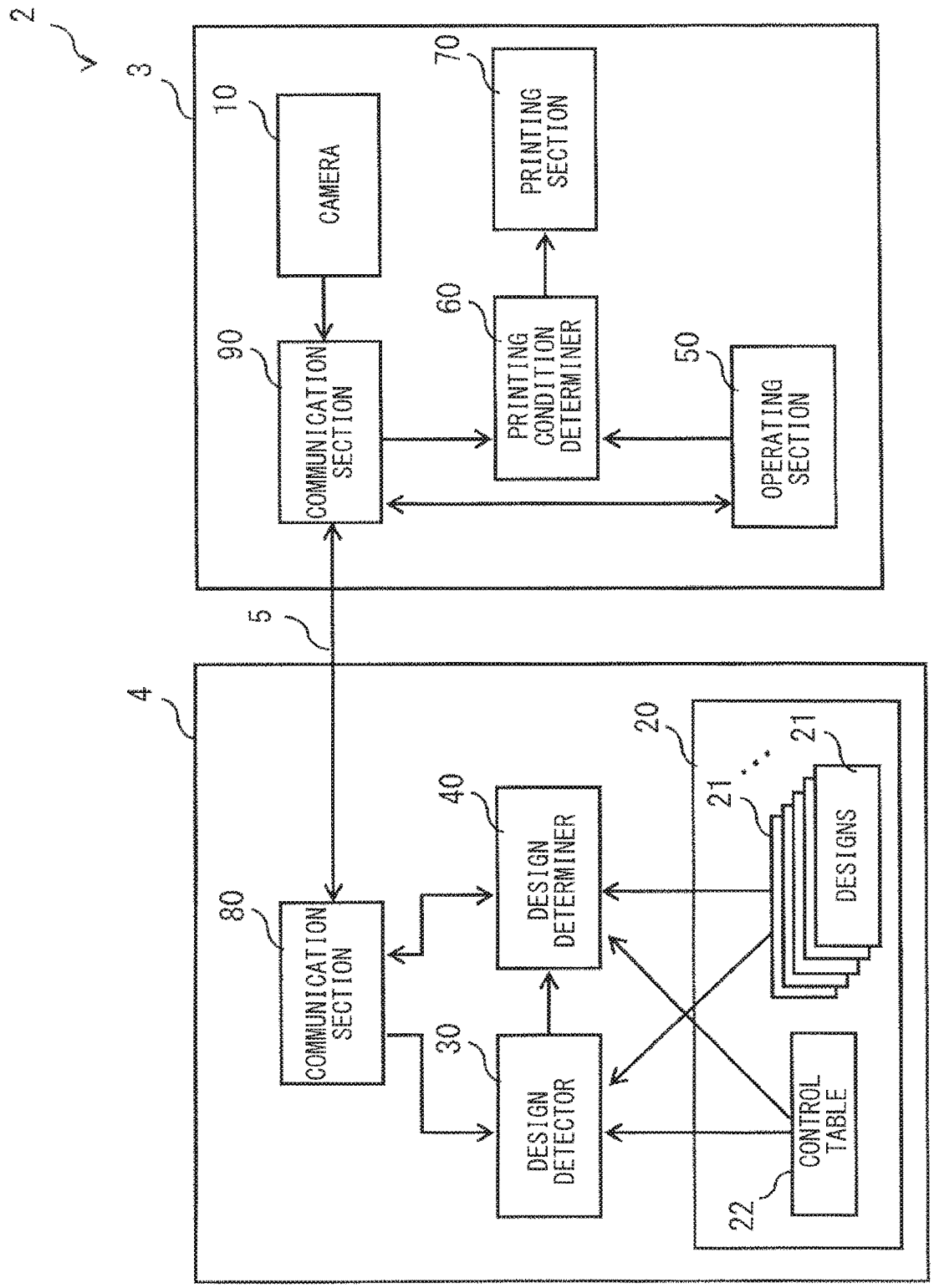
[FIG. 16]

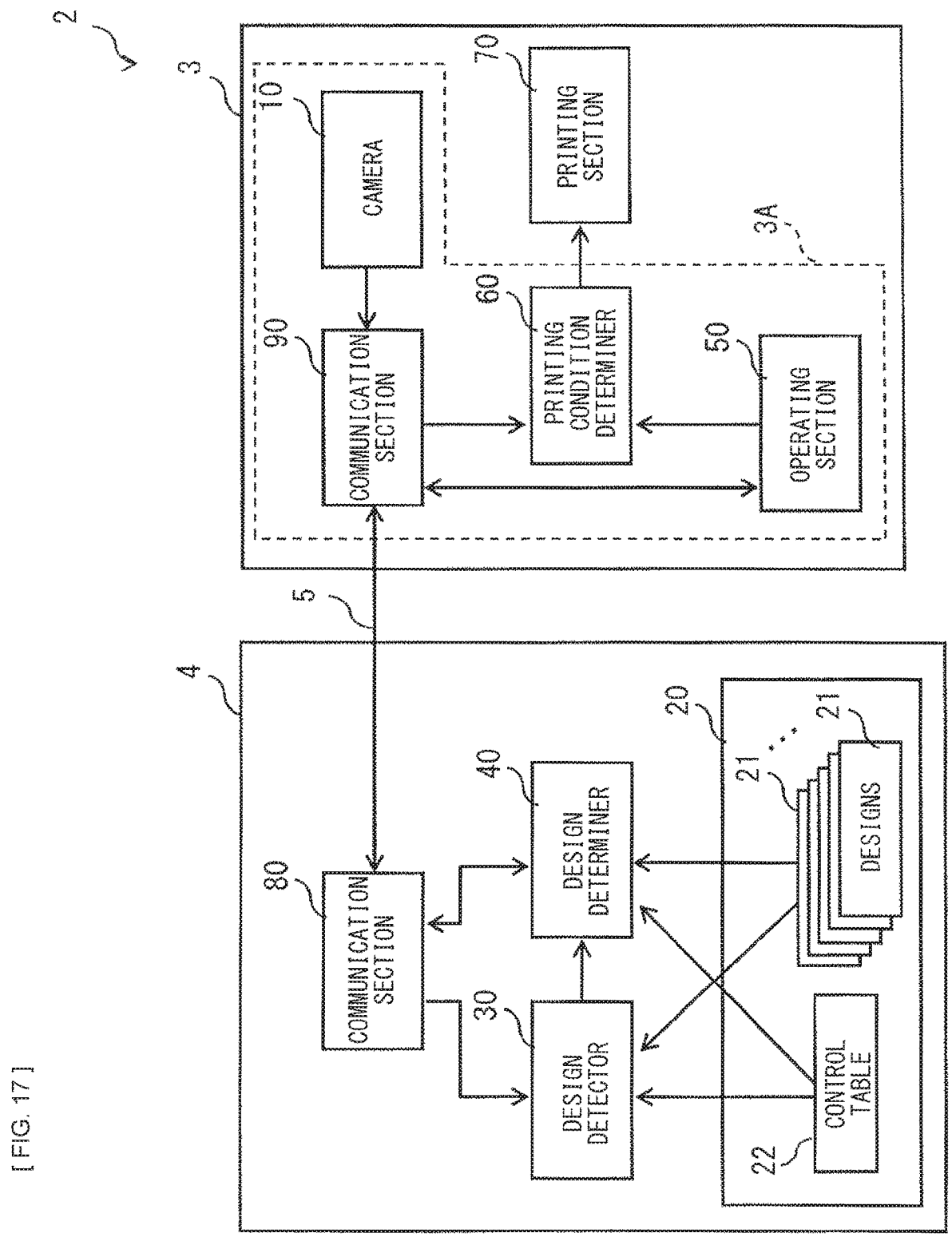
[FIG. 17]

[ FIG. 18 ]
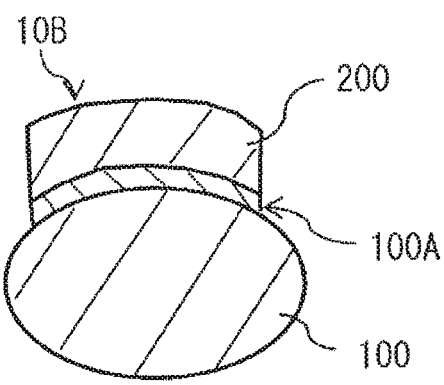
[ FIG. 19 ]
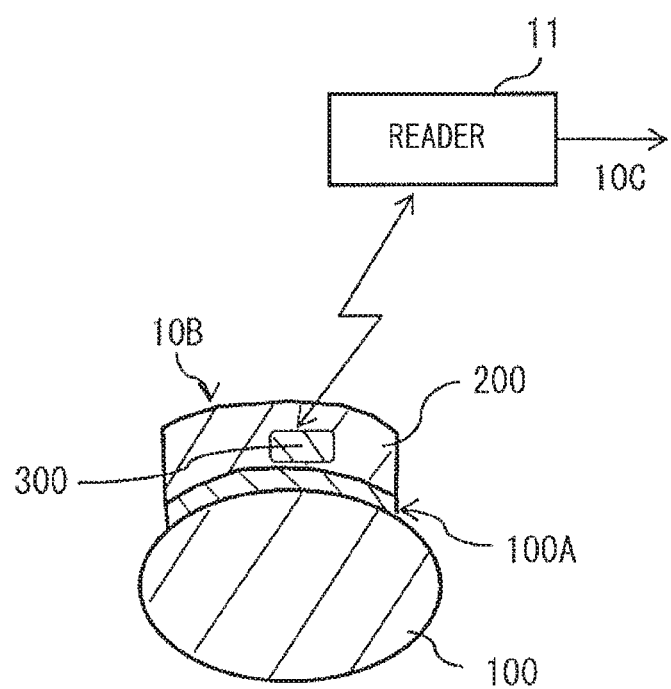

ELECTRONIC APPARATUS, INFORMATION PROCESSOR, PRINTING SYSTEM, AND PRINTING METHOD

CROSS REFERENCE TO RELATED APPLICATIONS

This application is a U.S. National Phase of International Patent Application No. PCT/JP2016/086616 filed on Dec. 8, 2016, which claims priority benefit of Japanese Patent Application No. JP 2015-247268 filed in the Japan Patent Office on Dec. 18, 2015. Each of the above-referenced applications is hereby incorporated herein by reference in its entirety.

TECHNICAL FIELD

The technology relates to an electronic apparatus, an information processor, a printing system, and a printing method.

BACKGROUND ART

In recent years, a gel nail in which a gel-like curable resin is solidified by an ultraviolet ray has become a trend. Further, recently, there are increasing number of people who enjoy the gel nail not only at a salon but also at home. In consideration of time and cost, enjoying the gel nail at home is superior to going to a salon. In order to enjoy the gel nail at home, however, tools and techniques are necessary. In terms of design and finishing, a home may be inferior to a salon in some cases.

Moreover, nowadays, a nail printer that prints a desired design on a nail or a nail chip has begun to be popular. It is possible for a home-use nail printer to eliminate effort and time to visit a salon, and to limit cost that occurs whenever the gel nail is applied. It is also possible to achieve the gel nail at home, which is not inferior to a salon also in terms of design and finishing.

In recent years, several techniques related to such a nail printer have been disclosed. For example, PTL 1 discloses a technique of printing a wide variety of design images on each nail. Further, PTL 2 discloses a technique of photographing a design image applied to a nail of another person and printing the design obtained by the photographing on a person's own nail or a nail chip sheet. Furthermore, PTL 3 discloses a nail decorative sheet including an electronic paper layer that allows for rewriting of a design image.

CITATION LIST

Patent Literature

PTL 1: Japanese Unexamined Patent Application Publication No. 2012-10848
PTL 2: Japanese Unexamined Patent Application Publication No. 2012-135587
PTL 3: Japanese Unexamined Patent Application Publication No. 2012-20035

SUMMARY OF THE INVENTION

Incidentally, existing nail printers print a design image selected by a user from a plurality of design images prepared in advance or a design image inputted by a user per se. Accordingly, it has not been possible for device side to automatically set, depending on circumstances, a design image for printing.

It is therefore desirable to provide an electronic apparatus, an information processor, a printing system, and a printing method that make it possible for device side to automatically set, depending on circumstances, a design image for printing.

An electronic apparatus according to an embodiment of the technology includes an obtaining section, a determining section, and an instructing section. The obtaining section obtains a first design image or corresponding data corresponding to the first design image. The determining section determines one or a plurality of second design images different from the first design image on the basis of the first design image or the corresponding data obtained by the obtaining section. The instructing section instructs printing of one or a plurality of the second design images determined by the determining section.

An information processor according to an embodiment of the technology includes a receiving section, a determining section, and a transmitting section. The receiving section receives, from a printer, a first design image or corresponding data corresponding to the first design image. The determining section determines one or a plurality of second design images different from the first design image on the basis of the first design image or the corresponding data received by the receiving section. The transmitting section transmits, to the printer, one or a plurality of the second design images determined by the determining section.

A printing system according to an embodiment of the technology includes a printer and an information processor that are communicatable to each other. The printer includes an obtaining section, a first transmitting section, a first receiving section, an instructing section, and a printing section. The obtaining section obtains a first design image or corresponding data corresponding to the first design image. The first transmitting section transmits, to the information processor, the first design image or the corresponding data obtained by the obtaining section. The first receiving section receives, from the information processor, one or a plurality of second design images different from the first design image. The instructing section instructs printing of one or a plurality of the second design images received by the first receiving section. The printing section performs printing in accordance with an instruction by the instructing section. The information processor includes a second receiving section, a determining section, and a second transmitting section. The second receiving section receives, from the printer, the first design image or the corresponding data. The determining section determines one or a plurality of the second design images on the basis of the first design image or the corresponding data received by the second receiving section. The second transmitting section transmits, to the printer, one or a plurality of the second design images determined by the determining section.

A printing method according to an embodiment of the technology includes the following two steps:
(A) determining, after obtaining a first design image or corresponding data corresponding to the first design image, one or a plurality of second design images different from the first design image on the basis of the obtained first design image or corresponding data; and
(B) printing determined one or a plurality of the second design images.

In the electronic apparatus, the information processor, the printing system, and the printing method according to the respective embodiments of the technology, one or a plurality of the second design images different from the first design image are determined on the basis of the obtained first design image or corresponding data. This makes it possible to set one or a plurality of design images for printing on the basis of the obtained first design image or corresponding data.

According to the electronic apparatus, the information processor, the printing system, and the printing method of the respective embodiments of the technology, one or a plurality of the second design images different from the first design image are determined on the basis of the obtained first design image or corresponding data, thus making it possible to automatically set, depending on circumstances, one or a plurality of the design images for printing. It is to be noted that the effects of the technology are not necessarily limited to those described here, and may be any of the effects described in the specification.

BRIEF DESCRIPTION OF DRAWINGS

FIG. 1 illustrates an example of functional blocks of a printer according to a first embodiment of the technology.

FIG. 2 describes design images of FIG. 1.

FIG. 3 illustrates an example of a configuration of a control table of FIG. 1.

FIG. 4 conceptually illustrates an example of a procedure of determining one or a plurality of design images.

FIG. 5 illustrates an example of a schematic configuration of the printer of FIG. 1.

FIG. 6 illustrates a state of an event in which the printer of FIG. 1 is used.

FIG. 7 illustrates an example of a printing procedure in the printer of FIG. 1.

FIG. 8 illustrates a state when fingers are inserted into the printer of FIG. 1.

FIG. 9 illustrates an example of a procedure in "setting of printing conditions" in FIG. 8.

FIG. 10 illustrates a state when printing has been performed on a finger nail.

FIG. 11 illustrates another example of the printing procedure in the printer of FIG. 1.

FIG. 12 illustrates an example of a procedure in "detection of design" in FIG. 11.

FIG. 13 illustrates an example of a procedure in "determination of design" in FIG. 11.

FIG. 14 illustrates another example of functional blocks of the printer of FIG. 1.

FIG. 15 illustrates an example of a schematic configuration of a printing system according to a second embodiment of the technology.

FIG. 16 illustrates an example of functional blocks of the printing system of FIG. 15.

FIG. 17 illustrates another example of the functional blocks of the printing system of FIG. 16.

FIG. 18 illustrates an example of a printed matter.

FIG. 19 illustrates a state in which communication is performed between an electronic tag embedded in the printed matter and a reader.

MODES FOR CARRYING OUT THE INVENTION

In the following, embodiments for carrying out the technology are described in detail with reference to drawings. It is to be noted that the description is given in the following order.

1. First Embodiment (Printer)
2. Modification Example of First Embodiment (Printer)
3. Second Embodiment (Printing System)
4. Modification Example of Second Embodiment (Printing System)
5. Modification Examples Common to Respective Embodiments 1. Embodiment

[Configuration]

First, description is given of a printer 1 according to a first embodiment of the technology. It is to be noted that the printer 1 corresponds to a specific example of an "electronic apparatus" of the technology. FIG. 1 illustrates an example of functional blocks of the printer 1. The printer 1 is an apparatus that prints a design image on a surface to be printed. The "surface to be printed" refers to a finger nail surface, a nail chip surface, or a surface of a nail chip sheet, for example. The "surface to be printed" may be a surface of a cup, a paper medium, etc., for example.

As illustrated in FIG. 1, the printer 1 includes a camera 10, a memory 20, a design detector 30, a design determiner 40, an operating section 50, a printing condition determiner 60, and a printing section 70, for example. The camera 10 corresponds to a specific example of an "obtaining section" or an "imaging device" of the technology. The memory 20 corresponds to a specific example of a "memory" of the technology. The design detector 30 and the design determiner 40 each correspond to a specific example of a "determining section" of the technology. The printing condition determiner 60 corresponds to a specific example of an "instructing section" of the technology. The printing section 70 corresponds to a specific example of a "printing section" of the technology.

The operating section 50 is a device that accepts an input of information from a user. The operating section 50 includes a touch panel that has an image display function, for example. The operating section 50 may include a keyboard, a mouse, etc., for example. It is to be noted that, in the following, description is given on an assumption that the operating section 50 includes the touch panel that has the image display function.

The camera 10 is an imaging device that is able to capture an image of a surface to be printed, and obtains a design image 10A by means of imaging. The design image 10A corresponds to a specific example of a "first design image" of the technology. The camera 10 is, for example, a two-lens camera, and outputs, as the design image 10A, a stereo image obtained by the two-lens camera to the design detector 30. It is to be noted that the imaging device may be a single-lens camera. In this case, however, the imaging device outputs, as the design image 10A, an image obtained by the single-lens camera to the design detector 30. The camera 10 includes a complementary metal oxide semiconductor (CMOS) image sensor or a charge coupled device (CCD) image sensor, for example.

The memory 20 stores a plurality of design images 21 and a control table 22, for example. The plurality of design images 21 in the memory 20 correspond to a specific example of "a plurality of third design images" of the technology. The control table 22 corresponds to a specific example of a "control table" of the technology. The memory 20 includes, for example, a non-volatile memory, and includes, for example, an electrically erasable programmable read-only memory (EEPROM), a flash memory, a resistive random-access memory, or the like. Each of the design images 21 corresponds to image data for printing, and includes an illustration, a photograph, or the like, for example.

Each of the design images 21 has an intrinsic design ID, for example, as illustrated in FIG. 2. For example, a file name of each of the design images 21 is configured by the design ID, or includes the design ID. Further, for example, the design ID is included in a property set for each of the design images 21. In this manner, the intrinsic design ID is associated with each of the design images 21.

FIG. 3 illustrates an example of a configuration of the control table 22. The control table 22 controls the plurality of design images 21 on a group basis. As illustrated in FIG. 3, the control table 22 includes a character ID, a group ID, a member ID, a type, a design ID, a group condition, and printability, for example. A set of data including the character ID, the group ID, the member ID, the type, the group condition, and the printability is associated with each design ID.

The character ID is an identifier assigned to a person who controls the printer 1, a place, or a character (hereinafter, referred to as "character, etc."). FIG. 3 exemplifies the control table 22 for at least the character, etc. of "character ID=1" and the character, etc. of "character ID=2". The "character" refers to a persona positioned to form a story. The group ID is an identifier assigned to a group of objects categorized depending on common characteristics. Each of the design images 21 stored in the memory 20 is associated with any of the group IDs. The member ID is an identifier assigned to each of the design images 21 in the plurality of design images 21 belonging to a common group ID. The type is a type of the design. In the control table 22 of FIG. 3, a "group design" and a "normal design" are specified as the type of the design. The "group design" refers to a special design prepared for each of the group IDs. The "normal design" refers to a normal design prepared for each of the group IDs.

The group condition is a selection condition at a time when the design determiner 40 selects one or a plurality of design images 21. The "member ID=2, 3" illustrated in FIG. 3 means that "a design ID corresponding to member ID=2 and a design ID corresponding to member ID=3 are included in a detection result 30A outputted from the design detector 30". That is, in FIG. 3, a group condition of design ID=1 is such a condition that "selection of a design image 21 of design ID=1 is permitted only when a design image 21 of design ID=2 and a design image 21 of design ID=3 have already been printed."

The printability is a flag that is set on the basis of a relationship between a design image 21 corresponding to the design ID and a character, etc. corresponding to the character ID. For example, there is a case where a design image 21 corresponding to a certain design ID includes a character, etc. corresponding to its character ID. In this case, when a character ID different from its character ID is inputted from the operating section 50, printability=unprintable is set for the design ID corresponding to the design image 21 in order to prevent the design image 21 from being selected.

The design detector 30 and the design determiner 40 determine, on the basis of the design image 10A obtained by the camera 10, one or a plurality of the design images 21 different from the design image 10A. The design detector 30 and the design determiner 40 determine one or a plurality of the design images 21 from the plurality of design images 21 belonging to the same group as a group of the design image 10A obtained by the camera 10. One or a plurality of the design images 21 to be determined by the design detector 30 and the design determiner 40 correspond to a specific example of a "second design image" of the technology.

FIG. 4 conceptually illustrates an example of a procedure of determining one or a plurality of the design images 21, in the design detector 30 and the design determiner 40. The design detector 30 detects one or a plurality of the design images 21 from the plurality of design images 21 belonging to the same group as the group of the design image 10A inputted from the camera 10. Hereinafter, one or a plurality of the design images 21 to be detected by the design detector 30 are referred to as one or a plurality of design images 30B.

Specifically, the design detector 30 performs matching between the design image 10A inputted from the camera 10 and a plurality of design images 21 read from the memory 20. For example, the design detector 30 determines whether or not the design image 10A inputted from the camera 10 includes the plurality of design images 21 read from the memory 20. As a result, in a case where they are matched (in a case of determining that they are included), the design detector 30 extracts, from the plurality of design images 21 belonging to the same group as a group of matched one or a plurality of design images 21, one or a plurality of design images 21 (30B) different from the matched design images 21. In this situation, the design detector 30 extracts, from the plurality of design images 21 belonging to the same group as the group of the matched one or a plurality of design images 21, one or a plurality of the design images 30B, on the basis of the control table 22 read from the memory 20. The design detector 30 outputs, as the detection results 30A, the design ID of each of the extracted one or a plurality of design images 30B and the member ID of each of the matched one or a plurality of design images 21, to the design determiner 40.

For example, the design detector 30 first reads, from the control table 22, the group ID of each of the matched one or a plurality of design images 21 (that are determined to be included). The design detector 30 next reads, from the control table 22, each design ID belonging to the same group ID as the read group ID together with the member ID corresponding to each design ID. In this situation, the design detector 30 excludes the design ID of each of the matched one or a plurality of design images 21 (that are determined to be included), from the read plurality of design IDs. As a result of the exclusion, the design detector 30 outputs, as the detection results 30A, remaining one or a plurality of design IDs and the member ID of each of the matched one or a plurality of design images 21, to the design determiner 40.

The design determiner 40 determines whether or not design IDs of one or a plurality of the design images 30B include an unprintable design ID on an as-needed basis. For example, in a case where the printability corresponding to a certain design ID falls under "unprintable", the design detector 30 reads a character ID corresponding to the design ID from the control table 22, and compares the read character ID with a character ID inputted from the operating section 50. As a result of the comparison, in a case where the read character ID is coincident with the character ID inputted from the operating section 50, the design detector 30 selects, from the design IDs of one or a plurality of the design images 30B, those excluding the design ID of "printability=unprintable". Further, as a result of the comparison, in a case where the read character ID is not coincident with the character ID inputted from the operating section 50, the design detector 30 selects the design ID of each of one or a plurality of the design images 30B including the design ID of "printability=unprintable".

The design determiner 40 further determines, on an as-needed basis, whether or not the design IDs of one or a plurality of the design images 30B include a design ID that does not satisfy the group condition. For example, in a case where the group condition corresponding to a certain design ID falls under "member ID=2, 3", the design detector 30 compares the member ID of each of the matched one or a plurality of design images 21 with the member ID=2, 3. As a result of the comparison, in a case where the member IDs of the matched one or a plurality of design images 21 do not include the member ID=2, 3, the design detector 30 selects, from the design IDs of one or a plurality of the design images 30B, those excluding the member ID having the group condition of "member ID=2, 3". Further, as a result of the comparison, in a case where the member IDs of the matched one or a plurality of design images 21 include the member ID=2, 3, the design detector 30 selects one or a plurality of design IDs having the group condition of "member ID=2, 3".

The design determiner 40 determines one or a plurality of design IDs for printing, from one or a plurality of the design IDs included in the detection result 30A or from one or a plurality of the design IDs selected on the basis of one or both of the group condition and the printability. The design determiner 40 outputs, to the printing condition determiner 60, design images 40A corresponding to determined one or a plurality of the design IDs. The design determiner 40 determines one or a plurality of the design IDs for printing, for example, in accordance with a predetermined rule without depending on an instruction from a user. The design determiner 40 may determine one or a plurality of the design IDs for printing, for example, in accordance with the instruction from the user. In the following, description is given of a method of determining one or a plurality of the design IDs for printing in accordance with the instruction from the user.

(Instruction from User)

The design determiner 40 outputs, to the operating section 50, one or a plurality of the design IDs included in the detection result 30A, or one or a plurality of the design IDs selected on the basis of one or both of the group condition and the printability. The design determiner 40 further outputs, to the operating section 50, the design image 21 corresponding to each design ID having been outputted to the operating section 50. Thereafter, the design determiner 40 accepts one or a plurality of the design IDs from the operating section 50. It is to be noted that, when one or a plurality of the design images 21 are inputted from the design determiner 40, the operating section 50 displays each of the inputted design images 21, and prompts a user to select one or a plurality of the design images 21. When the user selects one or a plurality of the design images 21, the operating section 50 outputs, to the design determiner 40, the design IDs of the selected one or a plurality of design images 21. The design determiner 40 determines one or a plurality of the design IDs inputted from the operating section 50, as one or a plurality of the design IDs for printing.

The printing condition determiner 60 determines a printing position of one or a plurality of design images 40A inputted from the design determiner 40. For example, the printing condition determiner 60 detects, from the design image 10A obtained by the camera 10, a region suitable for printing (e.g., an unprinted nail), and determines the detected region as the printing position. Further, for example, the printing condition determiner 60 outputs the design image 10A obtained by the camera 10 to the operating section 50, and thereafter accepts positional information from the operating section 50 to determine the accepted positional information as the printing position.

It is to be noted that, when the design image 10A is inputted from the printing condition determiner 60, the operating section 50 displays the inputted design image 10A, and prompts the user to select the printing position. When the user selects the printing position, the operating section 50 outputs the selected printing position to the printing condition determiner 60.

The printing condition determiner 60 instructs printing of one or a plurality of the design images 40A determined by the design determiner 40. Specifically, the printing condition determiner 60 outputs, as print data 60A, the determined printing position and one or a plurality of the design images 40A inputted from the design determiner 40, to the printing section 70.

The printing section 70 performs printing in accordance with the instruction by the printing condition determiner 60. Specifically, the printing section 70 prints one or a plurality of the design images 40A included in the print data 60A, at the printing position included in the print data 60A.

FIG. 5 illustrates an example of a schematic configuration of the printer 1. The printer 1 is, for example, an apparatus that prints a design image on a nail 100A that is a surface to be printed. The "surface to be printed" may be a surface other than the surface of the nail 100A, and may be the nail chip surface, or the surface of the nail chip sheet, for example. It is to be noted that the printer 1 is not limited to the configuration illustrated in FIG. 5.

As illustrated in FIG. 5, the printer 1 includes the camera 10, the memory 20, the operating section 50, the printing section 70, and a controller 140, for example. The controller 140 corresponds to the above-described design detector 30, the design determiner 40, and the printing condition determiner 60. The printing section 70 includes a light source section 110, a movable mirror 120, and a driver 130, for example.

The light source section 110 outputs collimated light on the basis of a drive signal from the driver 130. The light source section 110 includes, for example, a light-emitting element 111 that outputs an ultraviolet ray, and a collimator lens 112 disposed on an optical path of the ultraviolet ray.

The light-emitting element 111 includes, for example, one or a plurality of semiconductor lasers, or one or a plurality of light-emitting diodes. The semiconductor laser either may be a typical semiconductor laser, or may be a special semiconductor laser such as a second harmonic generation (SHG) laser. The light-emitting diode either may be a typical light-emitting diode, or may be a special light-emitting diode such as a super luminescent diode (SLD). The semiconductor laser or light-emitting diode that outputs an ultraviolet ray includes a GaInN-based semiconductor that is able to output light in 405 nm band, for example. The semiconductor laser that outputs an ultraviolet ray has a configuration in which, for example, an n-type AlGaN cladding layer, an n-type GaN guide layer, a GaInN multiple quantum well layer, a p-type AlGaN electronic blocking layer, a p-type GaN guide layer, a P-type AlGaN cladding layer, and a p-type GaN contact layer are stacked on an n-type GaN substrate. Typically, the semiconductor laser has a beam spot diameter that is smaller than a beam spot diameter of the light-emitting diode. Accordingly, in a case where one or a plurality of the semiconductor lasers are used as the light-emitting element 111, high energy density is easily obtained owing to very small beam spot diameter of the light-emitting element 111.

The collimator lens 112 causes light outputted from the light-emitting element 111 to be a parallel light flux (collimated light Lc1) by using refraction by means of a lens. It is to be noted that the light source section 110 may include, instead of the collimator lens 112, an optical component that causes the light outputted from the light-emitting element 111 to be a parallel light flux by using reflection by means of a mirror.

The movable mirror 120 is disposed on an optical path of the collimated light Lc1 outputted from the light source section 110. The movable mirror 120 displaces the optical path of light incident on the movable mirror 120. The movable mirror 120 reflects the collimated light Lc1 outputted from the light source section 110, and displaces the movable mirror 120 on the basis of the drive signal from the driver 130, thereby displacing an optical path of reflected light Lr1, thus causing the collimated light Lc1 (reflected light Lr1) to perform scanning on a target surface St. The movable mirror 120 includes a micro electro mechanical systems (MEMS) mirror, a polygon mirror, or a galvano mirror, for example.

The driver 130 drives the light source section 110 and the movable mirror 120 on the basis of a control signal from the controller 140. The controller 140 causes the driver 130 to control the light source section 110 and the movable mirror 120. The controller 140 causes the driver 130 to displace the movable mirror 120, and the displacement of the optical path by the movable mirror 120 causes the collimated light Lc1 (light reflected at the movable mirror 120 (reflected light Lr1)) to perform scanning on the nail 100A. The controller 140 further controls light emission of the light source section 110 on the basis of the print data 60A.

[Operation]

Next, description is given of an example of a printing procedure in the printer 1. In the following, the printing procedure is described separately for a time of initial printing and for a time of second printing or printing thereafter. Further, in the following, description is given, for example, of a printing procedure, assuming a case where a character A and a character B at a theme park each holds the printer 1 in an event in which a user C who is a visitor to the theme park collects a nail art of a character from the character whom the user C is to meet in the theme park, as illustrated in FIG. 6.

(Initial Printing)

FIG. 7 illustrates an example of a printing procedure at a time when the initial printing is performed in the printer 1. First, the printer 1 carries out an initial setting (step S101). For example, the printer 1 requests a holder of the printer to input a character ID as the initial setting. The holder inputs the character ID to the operating section 50 in response to the request from the printer 1. In a case where the holder is the character A, the character A inputs its own character ID (e.g., character ID=1) into the operating section 50. The operating section 50 outputs the inputted character ID to the design determiner 40.

Next, the printer 1 determines one or a plurality of the design images 40A (step S102).

The printer 1 first requests the user C to prepare a surface to be printed. The printer 1, for example, requests fingers of the user C to be put at a predetermined position in the printer 1. The user C puts own fingers at the predetermined position in the printer 1 in response to the request from the printer 1. The user C, for example, puts an own hand 101 to allow an own finger 100 to be inside an insertion opening 1B, as illustrated in FIG. 8. Next, the camera 10 photographs the surface to be printed (the nail 100A of the user C) to obtain the design image 10A. The camera 10 outputs the obtained design image 10A to the design detector 30.

The design detector 30 performs matching between the design image 10A inputted from the camera 10 and a plurality of design images 21 read from the memory 20. As a result, in a case where the design image 10A does not match with any of the plurality of design images 21, the design detector 30 outputs, to the design determiner 40, an unmatch signal that indicates unmatching. It is to be noted that, in a case where the design image 10A matches with any of the plurality of design images 21 in this situation, the design detector 30 makes a transition to the procedure in which second printing or printing thereafter is performed (described later). When the unmatch signal is inputted from the design detector 30, the design determiner 40 reads information concerning the group of the design images 21 from the control table 22, and outputs the read information to the operating section 50.

The operating section 50 displays the inputted information (the information concerning the group of the design images 21), and prompts the user to select a group. When the user inputs and selects a group, the operating section 50 outputs the selected group to the design determiner 40. The design determiner 40 reads, from the control table 22, the design ID and the member ID of each design image 21 belonging to the inputted group, and sets the read one or a plurality of design IDs and the read one or a plurality of member IDs, as the detection result 30A. The design determiner 40 selects, from the design IDs of one or a plurality of the design images 30B, those excluding an unprintable design ID on an as-needed basis. For example, in a case where the character ID inputted from the operating section 50 falls under ID=1, the design determiner 40 selects, from respective design IDs corresponding to character ID=1 in the control table 22, those excluding the design ID that falls under printability=unprintable. The design determiner 40 further selects, from one or a plurality of the design IDs, those excluding the design ID that does not satisfy the group condition, on an as-needed basis.

It is to be noted that, in a case where the design image 10A does not match with any of the plurality of design images 21, the design detector 30 may select a specific group. In this case, the design detector 30 reads, from the control table 22, the design ID and the member ID of each design image 21 belonging to the selected group, and sets the read one or a plurality of design IDs and the read one or a plurality of member IDs, as the detection result 30A.

The design determiner 40 determines one or a plurality of the design IDs for printing from one or a plurality of the design IDs included in the detection result 30A or from one or a plurality of the design IDs selected on the basis of one or both of the group condition and the printability. The design determiner 40 outputs, to the printing condition determiner 60, design images 40A corresponding to determined one or a plurality of the design IDs.

Next, the printer 1 sets a printing condition (step S103). Specifically, the printing condition determiner 60 determines the printing position of one or a plurality of the design images 40A inputted from the design determiner 40. For example, the printing condition determiner 60 detects, from the design image 10A obtained by the camera 10, a region suitable for printing (e.g., an unprinted nail), and determines the detected region as the printing position. Further, for example, the printing condition determiner 60 outputs, to the operating section 50, the design image 10A obtained by the camera 10 and one or a plurality of the design images 40A. The operating section 50 then displays the inputted design image 10A and one or a plurality of the design images 40A (step S201, FIG. 9). The operating section 50 further prompts the user to set the printing position. When the user inputs and sets the printing position (step S202, FIG. 9), the operating section 50 outputs the set printing position to the printing condition determiner 60. The printing condition determiner 60 outputs, as the print data 60A, the set printing position and one or a plurality of the design images 40A, to the printing section 70.

Finally, the printer 1 performs printing in accordance with the instruction of the printing condition determiner 60 (step S104). For example, the printer 1 prints one or a plurality of the design images 40A inputted from the printing condition determiner 60 at the printing position designated by the printing condition determiner 60. In this manner, the printing in the printer 1 is carried out. In this situation, for example, a printed matter 200 on which the design image 21 of a face of the character A is depicted is printed on the nail 100A of the finger 100, as illustrated in FIG. 10.

(Second Printing or Printing Thereafter)

FIG. 11 illustrates an example of the printing procedure at a time when second printing or printing thereafter is performed in the printer 1. First, the printer 1 determines one or a plurality of the design images 40A (step S301).

The printer 1 first requests the user C to prepare a surface to be printed. The printer 1, for example, requests fingers of the user C to be put at a predetermined position in the printer 1. The user C puts own fingers at the predetermined position in the printer 1 in response to the request from the printer 1. Next, the camera 10 photographs the surface to be printed to obtain the design image 10A (step S401, FIG. 12). The camera 10 outputs the obtained design image 10A to the design detector 30.

The design detector 30 performs matching between the design image 10A inputted from the camera 10 and a plurality of design images 21 read from the memory 20 (step S402, FIG. 12). As a result, in a case where the design image 10A does not match with any of the plurality of design images 21, the flow makes a transition to a procedure of performing a first printing or a printing thereafter. In a case where the design image 10A and the plurality of design images 21 match with each other, the design detector 30 extracts, from the plurality of design images 21 belonging to the same group as the group of matched one or a plurality of design images 21, one or a plurality of design images 21 (30B) different from the matched design images 21. In this situation, the design detector 30 extracts, from the plurality of design images 21 belonging to the same group as the group of the matched one or a plurality of design images 21, one or a plurality of the design images 30B, on the basis of the control table 22 read from the memory 20.

For example, the design detector 30 extracts, from the control table 22, and specifies the group ID of each of the matched one or a plurality of design images 21 (step S403, FIG. 12). The design detector 30 extracts, from a plurality of design IDs belonging to the same group ID as the specified group ID, one or a plurality of design IDs different from the design IDs of the matched design images 21. In this manner, the design detector 30 specifies one or a plurality of the design IDs to be outputted to the design determiner 40 (step S404, FIG. 12). The design detector 30 outputs, as the detection result 30A, the specified one or a plurality of design IDs and member IDs of the matched one or a plurality of design images 21, to the design determiner 40.

The design determiner 40 selects, from the design IDs of one or a plurality of the design images 30B, those excluding the unprintable design ID on an as-needed basis. For example, in a case where the character ID inputted from the operating section 50 falls under ID=1, the design determiner 40 selects, from respective design IDs corresponding to character ID=1 in the control table 22, those excluding the design ID that falls under printability=unprintable. The design determiner 40 further selects, from the design IDs of one or a plurality of the design images 30B, those excluding the design ID that does not satisfy the group condition, on an as-needed basis. For example, as illustrated in FIG. 3, in a case where member IDs belonging to group ID=1 are only 1, 2, and 3 and where a member ID having the group condition of "member ID=2, 3" is 1, when the detection result 30A includes the design ID corresponding to member ID=2 and the design ID corresponding to member ID=3, the design determiner 40 selects design IDs each having the group condition of "member ID=2, 3". In this situation, it follows that the design determiner 40 determines that collection of all the normal designs belonging to group ID=1 has been completed to select group designs belonging to group ID=1.

For example, the design determiner 40 determines whether or not the group condition is satisfied for each design ID of one or a plurality of the design images 30B (step S501, FIG. 13). As a result, in a case where there are one or a plurality of design IDs that satisfy the group condition, determination is made whether or not there is any printable group design for each design ID that satisfies the group condition (step S502, FIG. 13). As a result, in a case where there is a printable group design, one or a plurality of group designs belonging to the specified group ID are set as one or a plurality of the design images 40A (step S503, FIG. 13). Further, in a case where there is no printable group design, the procedure ends as it is in the design determiner 40.

Meanwhile, in a case where one or a plurality of the design IDs that satisfy the group condition are not present, determination is made whether or not there is any printable normal design for each design ID having no group condition setting (step S504, FIG. 13). As a result, in a case where there is the printable normal design, one or a plurality of the normal designs belonging to the specified group ID are set as one or a plurality of the design images 40A (step S505, FIG. 13). Further, in a case where there is no printable normal design, the procedure ends as it is in the design determiner 40.

The design determiner 40 determines one or a plurality of the design IDs for printing from one or a plurality of the design IDs included in the detection result 30A or from one or a plurality of the design IDs selected on the basis of one or both of the group condition and the printability. The design determiner 40 outputs, to the printing condition determiner 60, design images 40A corresponding to determined one or a plurality of the design IDs.

Next, the printer 1 sets a printing condition (step S302). Specifically, the printing condition determiner 60 determines the printing position of one or a plurality of the design images 40A inputted from the design determiner 40. For example, the printing condition determiner 60 detects, from the design image 10A obtained by the camera 10, a region suitable for printing (e.g., an unprinted nail), and determines the detected region as the printing position. Further, for example, the printing condition determiner 60 outputs, to the operating section 50, the design image 10A obtained by the camera 10 and one or a plurality of the design images 40A. The operating section 50 then displays the inputted design image 10A and one or a plurality of the design images 40A (step S201, FIG. 9). The operating section 50 further prompts the user to set the printing position. When the user inputs and sets the printing position (step S202, FIG. 9), the operating section 50 outputs the set printing position to the printing condition determiner 60. The printing condition determiner 60 outputs, as the print data 60A, the set printing position and one or a plurality of the design images 40A, to the printing section 70.

Finally, the printer 1 performs printing in accordance with the instruction of the printing condition determiner 60 (step S303). For example, the printer 1 prints one or a plurality of the design images 40A inputted from the printing condition determiner 60 at the printing position designated by the printing condition determiner 60. In this manner, the printing in the printer 1 is carried out.

Effects

Next, description is given of effects of the printer 1.

Existing printers print a design image selected by a user from a plurality of design images prepared in advance or a design image inputted by a user per se. Accordingly, it has not been possible to automatically set, depending on circumstances, one or a plurality of design images to be presented to a user, or a design image to be printed. As a result, it has not been possible to set, for example, a design image that reflects an activity or experience of a user, as the design image to be presented to the user, or as the design image to be printed.

Meanwhile, in the printer 1, one or a plurality of the design images 40A different from the design image 10A are determined on the basis of the design image 10A obtained by the camera 10. This enables the printer 1 to automatically set, depending on circumstances, one or a plurality of the design images 40A to be presented to the user or one or a plurality of the design images 40A to be printed, on the basis of the design image 10A. As a result, for example, it is possible for the printer 1 to automatically set, depending on circumstances, the image that reflects the activity or experience of the user, for example, as one or a plurality of the design images 40A to be presented to the user or one or a plurality of the design images 40A to be printed.

Further, the printer 1 includes the printing section 70 that performs printing in accordance with the instruction by the printing condition determiner 60, thus making it possible to immediately print one or a plurality of the design images 40A that are automatically set depending on circumstances. Hence, it is possible to perform printing in such a way as not to prevent the activity or experience of the user.

Further, the printer 1 includes the memory 20 that stores the plurality of design images 21, thus making it possible to automatically set one or a plurality of the design images 40A depending on circumstances even in a case of a poor communication environment. Hence, it is possible to perform printing in such a way as not to prevent the activity or experience of the user.

Further, in the printer 1, the control table 22 directed to controlling of the plurality of design images 21 on a group basis is stored in the memory 20. This enables the control table 22 to control relevance between one or a plurality of the design images 40A that are automatically set depending on circumstances and images having been printed in the past. As a result, it is possible to have a sense of uniformity in design in each of printed images. Hence, it is possible to perform such printing that reflects the activity or experience of the user.

Further, in the printer 1, design images printed in the past are obtained by the camera 10. This makes it possible to easily perform a dynamic setting of one or a plurality of the design images 40A by utilizing the matching between the design image 10A obtained by the camera 10 and the plurality of design images 21 read from the memory 20. Hence, it is possible to perform printing in such a way as not to prevent the activity or experience of the user.

2. Modification Example of First Embodiment

FIG. 14 illustrates a modification example of functional blocks of the printer 1. In the foregoing first embodiment, a unit including the camera 10, the memory 20, the design detector 30, the design determiner 40, the operating section 50, and the printing condition determiner 60 may be configured by an electronic apparatus 1A. The electronic apparatus 1A is configured by, for example, a mobile terminal such as a smartphone. In this case, the electronic apparatus 1A is detachable from a housing of the printer 1. Even in a case where the printer 1 has such a configuration, it is possible for the printer 1 to automatically set, depending on circumstances, one or a plurality of the design images 40A to be presented to the user or one or a plurality of the design images 40A to be printed, similarly to the foregoing first embodiment.

3. Second Embodiment

Next, description is given of a printing system 2 according to a second embodiment of the technology. FIG. 15 illustrates an example of a schematic configuration of the printing system 2. FIG. 16 illustrates an example of functional blocks of the printing system 2. The printing system 2 includes a printer 3 and an information processor 4. The printer 3 and the information processor 4 are each coupled to a network 5, and are communicatable to each other via the network 5.

(Network 5)

The network 5 may be, for example, a network that performs communication using a communication protocol (TCP/IP) that is normally utilized in the Internet, or may be a secure network that performs communication using a communication protocol of its own network. The network 5 is, for example, the Internet, an intranet, or a local area network. Coupling between the network 5 and the printer 3 or the information processor 4 may be made, for example, by a wired local area network (LAN) such as Ethernet (registered trademark), or may be made by a wireless LAN such as Wi-Fi, or by a mobile phone line, etc.

(Printer 3)

The printer 3 includes the camera 10, the operating section 50, the printing condition determiner 60, the printing section 70, and a communication section 90. The communication section 90 corresponds to a specific example of a "first transmitting section" or a "first receiving section" of the technology. The communication section 90 transmits the design image 10A obtained by the camera 10 to the information processor 4 (a communication section 80) via the network 5. The communication section 90 further receives, from the information processor 4 (the communication section 80), one or a plurality of design images 40A different from the design image 10A obtained by the camera 10, via the network 5, and outputs the received one or a plurality of design images 40A to the printing condition determiner 60.

The printing condition determiner 60 instructs printing of one or a plurality of the design images 40A received from the information processor 4. Specifically, the printing condition determiner 60 outputs, as the print data 60A, a determined printing position and one or a plurality of the design images 40A inputted from the design determiner 40, to the printing section 70. The printing section 70 performs printing in accordance with the instruction by the printing condition determiner 60. Specifically, the printing section 70 prints one or a plurality of the design images 40A included in the print data 60A, at the printing position included in the print data 60A.

(Information Processor 4)

The information processor 4 includes the memory 20, the design detector 30, the design determiner 40, and the communication section 80. The communication section 80 corresponds to a specific example of a "second transmitting section" or a "second receiving section" of the technology. The communication section 80 receives the design image 10A obtained by the camera 10 from the printer 3 (the communication section 90), and outputs the received design image 10A to the design detector 30. The design determiner 40 determines one or a plurality of the design images 40A on the basis of the design image 10A received by the communication section 80. The communication section 80 further transmits one or a plurality of the design images 40A determined by the design determiner 40 to the printer 3 (the communication section 90) via the network 5.

In the present embodiment, one or a plurality of the design images 40A different from the design image 10A obtained by the camera 10 are determined on the basis of the design image 10A obtained by the camera 10. This enables the printing system 2 to automatically set, depending on circumstances, one or a plurality of the design images 40A to be presented to the user or one or a plurality of the design images 40A to be printed, on the basis of the design image 10A obtained by the camera 10. Hence, it is possible for the printing system 2 to automatically set, depending on circumstances, one or a plurality of the design images 40A to be presented to the user or one or a plurality of the design images 40A to be printed.

4. Modification Example of Second Embodiment

FIG. 17 illustrates a modification example of functional blocks of the printing system 2. In the foregoing second embodiment, a unit including the camera 10, the operating section 50, the printing condition determiner 60, and the communication section 90 may be configured by an electronic apparatus 3A. The electronic apparatus 3A includes, for example, a mobile terminal such as a smartphone. In this case, the electronic apparatus 3A is detachable from a housing of the printer 3. Even in a case where the printing system 2 has such a configuration, it is possible for the printing system 2 to automatically set, depending on circumstances, one or a plurality of the design images 40A to be presented to the user or one or a plurality of the design images 40A to be printed, similarly to the foregoing second embodiment.

5. Modification Examples Common to Respective Embodiments

Modification Example A

In the foregoing embodiments and modification examples thereof, for example, as illustrated in FIG. 18, a design image 10B is formed on a surface to be printed, and the design image 10B on the surface to be printed is photographed by the camera 10, thereby causing the design image 10A to be obtained. It is to be noted that FIG. 18 exemplifies a state in which the printed matter 200 is formed on the surface of the nail 100A of the finger 100.

However, in the foregoing embodiments and modification examples thereof, for example, as illustrated in FIG. 19, an electronic tag 300 may be embedded in the printed matter 200 to which the design image 10B is applied, and a reader 11 communicatable to the electronic tag 300 may be provided instead of the camera 10. Any one of the plurality of design images 21 stored in the memory 20 is printed by the printer 1 to form the design image 10B.

The electronic tag 300 is a generic term of a radio frequency identification (RFID) tag, an integrated circuit (IC) tag, and the like. The electronic tag 300 includes an IC chip and an antenna, for example. The IC chip includes a control circuit and a memory circuit, for example. The memory circuit in the IC chip includes corresponding data corresponding to the design image 10B applied to the printed matter 200, and includes, for example, a design ID of the design image 10B. The reader 11 includes a communication section and an operation section, for example. The communication section transmits a radio wave to the electronic tag 300, and receives the radio wave transmitted from the electronic tag 300. The operation section takes out data included in the radio wave having been received by the communication section, and outputs the data to the design detector 30 or the communication section 90.

The reader 11 obtains one or a plurality of design IDs by reading an electronic tag 300. One or a plurality of the design IDs correspond to a specific example of "corresponding data" of the technology. The reader 11 transmits a radio wave to the electronic tag 300. The electronic tag 300 utilizes electric power generated by the radio wave transmitted from the reader 11 to read data stored inside the electronic tag 300, and transmits the radio wave including the read data to the reader 11. The reader 11 receives the radio wave transmitted from the electronic tag 300 to take out the data included in the received radio wave. Here, the data read from the electronic tag 300 are the corresponding data corresponding to the design image 10B applied to the printed matter 200, and include, for example, the design ID of the design image 10B. It is to be noted that, in a case where a plurality of printed matters 200 are disposed, the reader 11 obtains the plurality of design IDs by reading an electronic tag 300 embedded in each of the printed matters 200.

In the present modification example, one or a plurality of design images 40A different from the design image 10B applied to the printed matter 200 in which the electronic tag 300 is embedded are determined on the basis of the data (e.g., the design ID) obtained from the electronic tag 300. This makes it possible to set one or a plurality of the design images 40A to be presented to the user or one or a plurality of the design images 40A to be printed on the basis of the data (e.g., the design ID) obtained from the electronic tag 300. Hence, it is possible for the printer 1 or the printing system 2 to automatically set, depending on circumstances, one or a plurality of the design images 40A to be presented to the user or one or a plurality of the design images 40A to be printed.

Modification Example B

In the foregoing embodiments and modification examples thereof, the design image (e.g., the design image 10B) applied to the surface to be printed may be a design image in which an insertion design image is synthesized with an original design image. The insertion design image is an image obtained by converting, on a predetermined algorithm, the design ID of the design image 21 corresponding to the design image (e.g., the design image 10B) applied to the surface to be printed.

In the present modification example, the camera 10 obtains the design image 10A by means of imaging of the design image (e.g., the design image 10B) applied to the surface to be printed. The camera 10 further separates the insertion design image from the design image 10A, and obtains the design ID of the design image 21 corresponding to the design image (e.g., the design image 10B) applied to the surface to be printed on the basis of the insertion design image obtained by the separation. It is to be noted that, in a case where the plurality of design images 10B are formed, the camera 10 obtains, from respective design images 10B, the design ID of each of the design images 21 corresponding to the respective design images 10B. The camera 10 outputs, as a detection result 10C, the obtained one or a plurality of design IDs to the design detector 30.

The design detector 30 determines, from one or a plurality of the design IDs included in the detection result 10C, one or a plurality of design IDs for printing. It is to be noted that, the design detector 30 may determine one or a plurality of the design IDs for printing from one or a plurality of design IDs that are selected from one or a plurality of the design IDs included in the detection result 10C on the basis of one or both of the group condition and the printability.

In the present modification example, one or a plurality of the design images 40A different from the design image 10A are determined on the basis of the detection result 10C obtained by the camera 10. This enables the printer 1 or the printing system 2 to automatically set, depending on circumstances, one or a plurality of the design images 40A to be presented to the user or one or a plurality of the design images 40A to be printed, on the basis of the design image 10A. As a result, for example, it is possible for the printer 1 or the printing system 2 to automatically set, depending on circumstances, the image that reflects the activity or experience of the user, for example, as one or a plurality of the design images 40A to be presented to the user or one or a plurality of the design images 40A to be printed.

Although the technology has been described above referring to the plurality of embodiments and the modification examples thereof, the technology is not limited to the foregoing embodiments, etc., and may be modified in a variety of ways. It is to be noted that effects described herein are merely illustrative. The effects of the technology are not limited to those described in the specification. The technology may have effects other than those described in the specification.

Although the foregoing embodiments, etc. exemplify the case where a plurality of printers 1 are used at a theme park, it is of course possible to use them for other applications.

For example, the plurality of printers 1 may be used in an event in which a user C who is a tourist to a notable site such as a world heritage site collects, for each visited location, a nail art to which a design of each location is applied. In this case, the printer 1 is installed for each predetermined location, and a character ID for each location is set in each of the printers 1. Further, for example, in a case where collection of a normal design of a certain group is completed, the printer 1 prints a special design (group design) on a surface to be printed such as the nail 100A of the user C. Here, as indicated in the foregoing modification example B, the printer 1 may print, on the surface to be printed such as the nail 100A, the design image in which the insertion design image is synthesized with the original design image. In this situation, the insertion design image is an image obtained by converting, on a predetermined algorithm, a name of the visited location, for example.

Further, for example, the plurality of printers 1 may be used in an event in which a user C who is a runner in a marathon collects, for each visited check point, a nail art to which a design related to the check point is applied. In this case, the printer 1 is installed for each check point, and a character ID for each check point is set in each of the printers 1. Here, for example, a predetermined electronic tag 300 may be embedded, in printing for each check point. In such a case, when the electronic tag 300 embedded at each check point is detected (when collection of a normal design of a certain group is completed) at the finish point, the printer 1 prints a design (group design) indicating running the whole distance on the surface to be printed such as the nail 100A of the user C.

Furthermore, although the foregoing embodiments, etc., exemplify the case where the nail 100A of the user C is adopted as the surface to be printed, for example, a stamp rally sheet, a circumferential surface of a mug, a smartphone cover, and the like may be adopted as the surface to be printed.

Further, for example, the technology may have the following configurations.

(1)

An electronic apparatus including:

an obtaining section that obtains a first design image or corresponding data corresponding to the first design image;

a determining section that determines one or a plurality of second design images different from the first design image on the basis of the first design image or the corresponding data obtained by the obtaining section; and an instructing section that instructs printing of one or a plurality of the second design images determined by the determining section.

(2)

The electronic apparatus according to (1), further including a memory that stores a plurality of third design images, in which the determining section determines one or a plurality of the second design images from a plurality of the third design images.

(3)

The electronic apparatus according to (2), in which the memory further stores a control table directed to controlling of a plurality of the third design images on a group basis, and the determining section determines one or a plurality of the second design images from a plurality of the third design images belonging to the same group as a group of the first design image.

(4)

The electronic apparatus according to (3), in which the determining section performs matching between the first design image and a plurality of the third design images, and determines, as a result of the matching, one or a plurality of the second design images from a plurality of the third design images belonging to the same group as a group of one or a plurality of the third design images that are matched.

(5)

The electronic apparatus according to any one of (1) to (4), in which the obtaining section includes an imaging device that obtains the first design image by means of imaging.

(6)

The electronic apparatus according to any one of (1) to (4), in which the obtaining section includes a reader that captures, as the first design image, a design image in which an insertion design image is synthesized with an original design image, and thereafter obtains the corresponding data on the basis of the insertion design image separated from the first design image.

(7)

The electronic apparatus according to any one of (1) to (4), in which the obtaining section includes a reader that obtains the corresponding data by reading an electronic tag.

(8)

The electronic apparatus according to any one of (1) to (7) further including a printing section that performs printing in accordance with an instruction by the instructing section.

(9)

An information processor including:

a receiving section that receives, from a printer, a first design image or corresponding data corresponding to the first design image;

a determining section that determines one or a plurality of second design images different from the first design image on the basis of the first design image or the corresponding data received by the receiving section; and a transmitting section that transmits, to the printer, one or a plurality of the second design images determined by the determining section.

(10)

The information processor according to (9), further including a memory that stores a plurality of third design images, in which the determining section determines one or a plurality of the second design images from a plurality of the third design images.

(11)

The information processor according to (10), in which the memory further stores a control table directed to controlling of a plurality of the third design images on a group basis, and the determining section determines one or a plurality of the second design images from a plurality of the third design images belonging to the same group as a group of the first design image.

(12)

The information processor according to (11), in which the determining section performs matching between the first design image and a plurality of the third design images, and determines, as a result of the matching, one or a plurality of the second design images from a plurality of the third design images belonging to the same group as a group of one or a plurality of the third design images that are matched.

(13)

A printing system including a printer and an information processor that are communicatable to each other, the printer including an obtaining section that obtains a first design image or corresponding data corresponding to the first design image, a first transmitting section that transmits, to the information processor, the first design image or the corresponding data obtained by the obtaining section, a first receiving section that receives, from the information processor, one or a plurality of second design images different from the first design image, an instructing section that instructs printing of one or a plurality of the second design images received by the first receiving section, and a printing section that performs printing in accordance with an instruction by the instructing section, the information processor including a second receiving section that receives, from the printer, the first design image or the corresponding data, a determining section that determines one or a plurality of the second design images on the basis of the first design image or the corresponding data received by the second receiving section, and a second transmitting section that transmits, to the printer, one or a plurality of the second design images determined by the determining section.

(14)

A printing method including:

determining, after obtaining a first design image or corresponding data corresponding to the first design image, one or a plurality of second design images different from the first design image on the basis of the first design image or the corresponding data obtained; and printing determined one or a plurality of the second design images.

This application claims the benefit of Japanese Priority Patent Application JP2015-247268 filed with the Japan Patent Office on Dec. 18, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An electronic apparatus, comprising:
an obtaining section configured to obtain at least one of a first design image or corresponding data corresponding to the first design image;
a memory configured to store a plurality of third design images and a control table, wherein the control table includes information of each group of the plurality of third design images;
a determining section configured to determine at least one second design image, of a plurality of second design images, from a first set of third design images of the plurality of third design images based on:
the at least one of the first design image or the corresponding data, and
the control table, wherein
the plurality of second design images is different from the first design image, and
the first set of third design images belongs to a same group as a group of the first design image in the control table; and
an instructing section configured to control a printing operation of the determined at least one second design image.

2. The electronic apparatus according to claim 1, wherein the determining section is further configured to:
execute a matching operation between the first design image and the plurality of third design images;
obtain at least one third design image of the plurality of third design images that matches with the first design image, wherein the at least one third design image is obtained based on the matching operation; and
determine the at least one second design image from a second set of third design images of the plurality of the third design images, wherein the second set of third design images belongs to a same group as a group of the at least one third design image.

3. The electronic apparatus according to claim 1, wherein the obtaining section comprises an imaging device, and the imaging device is configured to obtain the first design image.

4. The electronic apparatus according to claim 1, wherein the obtaining section comprises a reader, and
the reader is configured to:
  capture, as the first design image, a specific design image in which an insertion design image is synthesized with an original design image;
  separate the insertion design image from the first design image; and
  obtain the corresponding data based on a basis of the insertion design image separated from the first design image.

5. The electronic apparatus according to claim 1, wherein the obtaining section comprises a reader, and
the reader is configured to read an electronic tag to obtain the corresponding data.

6. The electronic apparatus according to claim 1, further comprising a printing section configured to print the at least one second design image based on the control of the printing operation by the instructing section.

7. An information processor, comprising:
  a receiving section configured to receive, from a printer, at least one of a first design image or corresponding data corresponding to the first design image;
  a memory configured to store a plurality of third design images and a control table, wherein the control table includes information of each group of the plurality of third design images;
  a determining section configured to determine at least one second design image, of a plurality of second design images, from a first set of third design images of the plurality of third design images based on:
    the at least one of the first design image or the corresponding data, and
    the control table, wherein
      the plurality of the second design images is different from the first design image, and
      the first set of third design images belongs to a same group as a group of the first design image in the control table; and
  a transmitting section configured to transmit, to the printer, the determined at least one second design image.

8. The information processor according to claim 7, wherein the determining section is further configured to:
  execute a matching operation between the first design image and the plurality of third design images;
  obtain at least one third design image of the plurality of third design images that matches with the first design image, wherein the at least one third design image is obtained based on the matching operation; and
  determine the at least one second design image from a second set of third design images of the plurality of the third design images, wherein the second set of third design images belongs to a same group as a group of the at least one third design image.

9. A printing system, comprising:
a printer; and
an information processor, wherein
  the printer includes:
    an obtaining section configured to obtain at least one of a first design image or corresponding data corresponding to the first design image;
    a first transmitting section configured to transmit, to the information processor, the at least one of the first design image or the corresponding data;
    a first receiving section configured to receive, from the information processor, at least one second design image of a plurality of second design images, wherein the plurality of second design images is different from the first design image;
    an instructing section configured to control a printing operation of the received at least one second design image; and
    a printing section configured to print the received at least one second design image based on the control of the printing operation by the instructing section, and
  the information processor that includes:
    a second receiving section configured to receive, from the printer, the transmitted at least one of the first design image or the corresponding data;
    a memory configured to store a plurality of third design images and a control table, wherein the control table includes information of each group of the plurality of third design images;
    a determining section configured to determine the at least one second design image from a set of third design images of the plurality of third design images based on:
      the at least one of the first design image or the corresponding data received by the second receiving section, and
      the control table,
      wherein the set of third design images belongs to a same group as a group of the first design image in the control table; and
    a second transmitting section configured to transmit, to the printer, the determined at least one second design image.

10. A printing method, comprising:
obtaining at least one of a first design image or corresponding data corresponding to the first design image;
storing, in a memory, a plurality of third design images and a control table, wherein the control table includes information of each group of the plurality of third design images,
determining, after the at least one of the first design image or the corresponding data is obtained, at least one second design image of a plurality of second design images, wherein
  the at least one second design image is determined from a set of third design images of the plurality of third design images based on:
    the at least one of the first design image or the corresponding data, and
    the control table,
  the plurality of second design images is different from the first design image, and
  the set of third design images belongs to a same group as a group of the first design image in the control table; and
printing the determined at least one second design image.

* * * * *